United States Patent [19]
Patel et al.

[11] Patent Number: 6,115,251
[45] Date of Patent: Sep. 5, 2000

[54] COOLING APPARATUS FOR COMPUTER SUBSYSTEM

[75] Inventors: Chandrakant Patel, Fremont; Edward M. Aoki, Cupertino; Cullen Bash, San Francisco, all of Calif.

[73] Assignee: Hewlett Packard Company, Palo Alto, Calif.

[21] Appl. No.: 09/294,305

[22] Filed: Apr. 15, 1999

[51] Int. Cl.⁷ .................................................. H05K 7/20
[52] U.S. Cl. .................. 361/699; 165/80.4; 165/104.33; 174/15.1; 174/15.2; 361/700; 361/701
[58] Field of Search ............................. 165/80.4, 104.33; 174/15.1, 15.2; 361/687, 689, 694–695, 698–699, 700–704, 707, 715

[56] References Cited

U.S. PATENT DOCUMENTS

| | | | |
|---|---|---|---|
| 4,317,952 | 3/1982 | Armor et al. ............................. | 361/699 |
| 4,414,604 | 11/1983 | Matsui et al. ............................ | 361/385 |
| 4,646,202 | 2/1987 | Hook et al. .............................. | 361/698 |
| 4,958,257 | 9/1990 | Wenke .................................... | 361/700 |
| 5,424,916 | 6/1995 | Martin ..................................... | 361/692 |
| 5,493,474 | 2/1996 | Schkrohowsky et al. .............. | 361/695 |

*Primary Examiner*—Gregory Thompson

[57] ABSTRACT

An improved apparatus is disclosed for cooling the power dissipating components of a computer subsystem, including microprocessors and hard disk drive assemblies. The apparatus utilizes the computer subsystem's chassis or enclosure, by configuring it as a roll bond panel formed from two sheets bonded together to define a fluid channel therebetween. Various concentrated sources of power dissipation are mounted within the enclosure on special component panels that themselves define a fluid channel. A working fluid is disposed within the channels of the component panels and the enclosure panel. During operation, heat generated by the sources of power dissipation is transferred to the working liquid within the fluid channels of the component panels and, in turn, to the working fluid disposed within the fluid channel of the enclosure panel, for dissipation by convection. In one disclosed embodiment, the working fluid undergoes a reversible phase change, to facilitate an efficient transfer of heat throughout the enclosure panel and thereby to heat the panel to a substantially uniform temperature.

19 Claims, 4 Drawing Sheets

COOLING APPARATUS FOR COMPUTER SUBSYSTEM

BACKGROUND OF THE INVENTION

This invention relates generally to apparatus for cooling computer subsystems and, more particularly, to such apparatus that reduce or eliminate the need for fans or other devices for moving air.

Heat dissipation is an important consideration in the design of modern-day computer subsystems, especially as the power levels of such subsystems continue to grow. Major sources of heat in such subsystems include microprocessors and hard disk drive assemblies. Future microprocessor modules incorporated into workstations and into server applications are expected to dissipate 150 to 200 watts each. A typical multi-processor system incorporating 32 microprocessors is expected to dissipate 10 to 12 kilowatts. Similarly, future hard disk drive assemblies incorporated into such workstations and server applications are expected to dissipate more than 25 watts each. Many of such workstations and servers will incorporate multiple hard disk drive assemblies in close proximity to each other, thus posing a significant thermal cooling challenge.

In the past, computer subsystems of this kind have incorporated within their enclosures cooling devices such as heat sinks and air movers in the form of fans. Air volume flow rates on the order of 2.5 to 5 liters/second, at a velocity of 2 to 3 meters/second, typically have been required for each microprocessor.

As the power levels of such computer subsystems have increased, it has become increasingly difficult to adequately cool the subsystems' power dissipating components. Generally, such cooling has been achieved by increasing the air mass flow rates and by applying extended surfaces to disk drive assemblies. Large multi-processor systems and large multi-disk drive systems used in dedicated computer rooms can be cooled by moving air at high mass flow rates, and the resulting acoustic noise generally can be tolerated. Multi-processor and multi-disk systems used in office environments, on the other hand, must meet more stringent acoustic emission guidelines and regulations, as well as customer/user requirements. In these cases, cooling the systems by increasing the air mass flow rates is not considered a practical option.

A further consideration is that high-end servers housing multiple microprocessors, associated memory devices, and ASICs, and/or housing multiple hard disk drive assemblies, ordinarily will require compact physical packaging to meet performance goals. This requirement, of course, conflicts with the requirement to efficiently cool the systems' power dissipating components.

Some efforts have been made in the past to cool electronic systems using a working fluid that undergoes a reversible phase change. Specifically, power dissipating components such as power transistors have been mounted directly to an external panel of such systems, and a sealed fluid channel is formed in the panel for carrying the working fluid. The working fluid absorbs heat by evaporating in the portion of the fluid channel adjacent to the power transistors, and it releases heat by condensing in other portions of the fluid channel.

Although the cooling apparatus described briefly above has been effective in cooling power transistors mounted in the manner described, the apparatus has not proven to be entirely satisfactory. Specifically, the design configuration has not proven to be sufficiently versatile to efficiently cool power dissipating components that are mounted in positions other than directly on an external panel. Such components can include microprocessors mounted on a printed circuit board and hard disk drive assemblies It should, therefore, be appreciated that a need remains for an apparatus for effectively cooling more of a computer subsystem's power dissipating components, without exceeding acoustic emission guidelines and regulations, and without exceeding reasonable constraints on the subsystem's physical size. The present invention fulfills this need and provides related advantages.

SUMMARY OF THE INVENTION

The present invention is embodied in a cooling apparatus for a computer subsystem of a kind having one or more concentrated sources of power dissipation, e.g., one or more microprocessors and/or one or more hard disk drive assemblies, without exceeding acoustic emission guidelines and regulations, and without exceeding reasonable constraints on the subsystem's physical size. The cooling apparatus utilizes an external panel of the subsystem's enclosure, with the panel taking the form of two sheets bonded together to define a fluid channel therebetween, and it further utilizes an internal component panel that contacts the concentrated source of power dissipation, such component panel likewise defining a fluid channel. A working fluid is disposed within the fluid channels of both the external panel and the component panel. A thermally conductive interface material can be disposed between the component panel and the concentrated source of power dissipation, to enhance the conduction of heat.

In one embodiment of the invention, the fluid channels of the internal component panel and the external panel are separately sealed, and the working fluid disposed within the channels undergoes a reversible phase change. Specifically, the working fluid disposed within the sealed fluid channel of the component panel absorbs heat by evaporation in portions of the channel located adjacent to the concentrated source of power dissipation, and it releases heat by condensation in portions of the channel located adjacent to the enclosure panel. Similarly, the working fluid disposed within the sealed fluid channel of the enclosure panel absorbs heat by evaporation in portions of the channel located adjacent to the component panel, and it releases heat by condensation in other portions of the channel. This effectively controls the temperature of the concentrated source of power dissipation.

In other, more detailed features of the invention, the liquid that condenses within the sealed fluid channel of the external panel is transported by gravity back to the portion of the channel adjacent to the internal component panel. In addition, a wick material can be disposed within the fluid channels, to assist in the transport of condensed liquid, either with or against gravity. Further, the fluid channel of the enclosure panel can take the form of a lattice of interconnected paths, and it can be configured to maintain the external panel at a substantially uniform temperature.

In an alternative embodiment of the invention, the fluid channels of the external panel and the internal component panel are connected together so as to define a closed-loop fluid path, and a working liquid is disposed along the entire fluid path. In addition, the cooling apparatus further includes a pump that pumps the liquid along the closed-loop fluid path.

Other features and advantages of the present invention should become apparent from the following description of the preferred embodiments, taken in conjunction with the accompanying drawings, which illustrate, by way of example, the principles of the invention.

DESCRIPTION OF THE PREFERRED EMBODIMENTS

Figure 1:
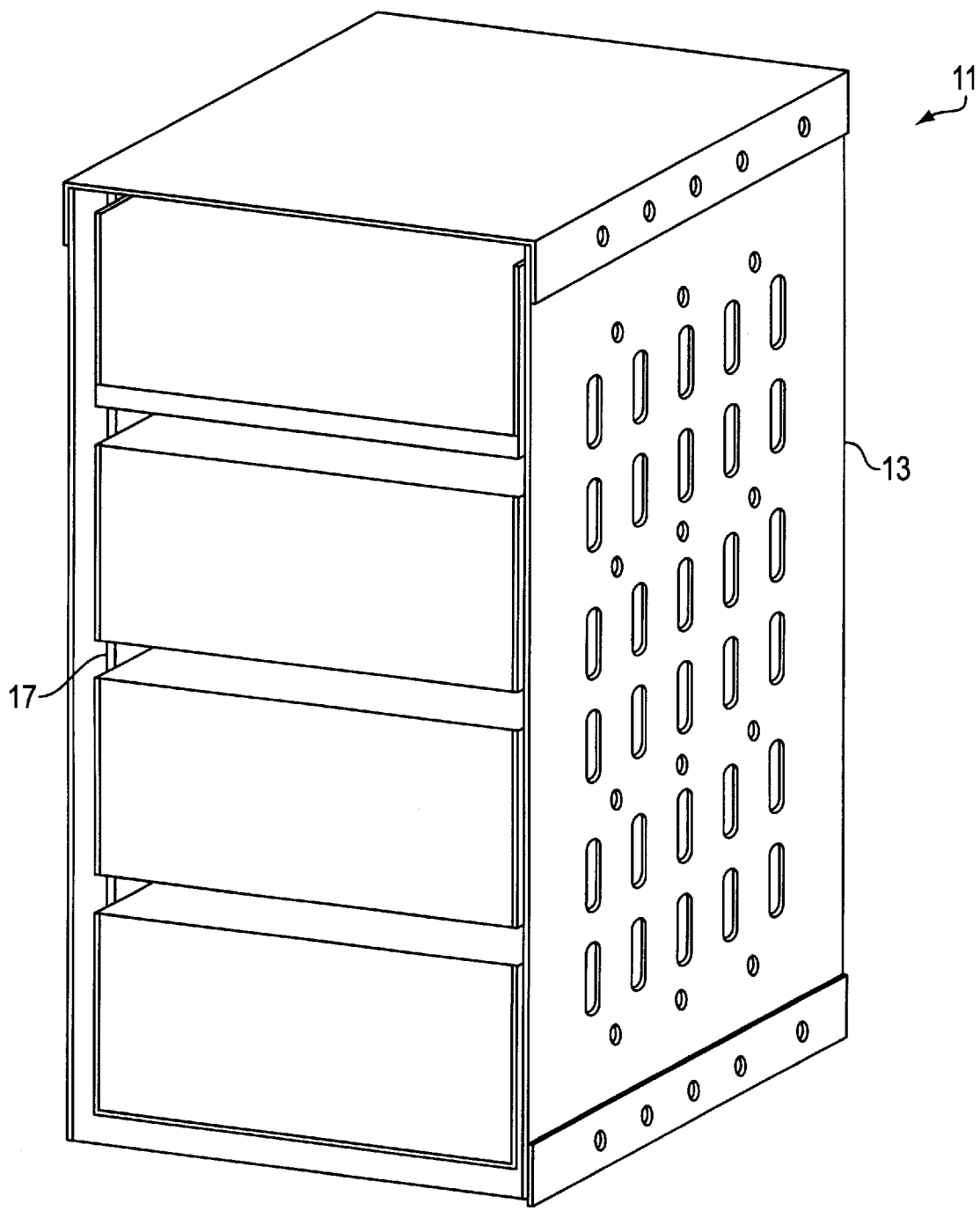
FIG. 1 is an isometric view of a first computer subsystem incorporating a cooling apparatus in accordance with the invention, wherein the subsystem's enclosure is specially configured as a roll bond panel, to function as a part of the cooling apparatus.
Figure 2:
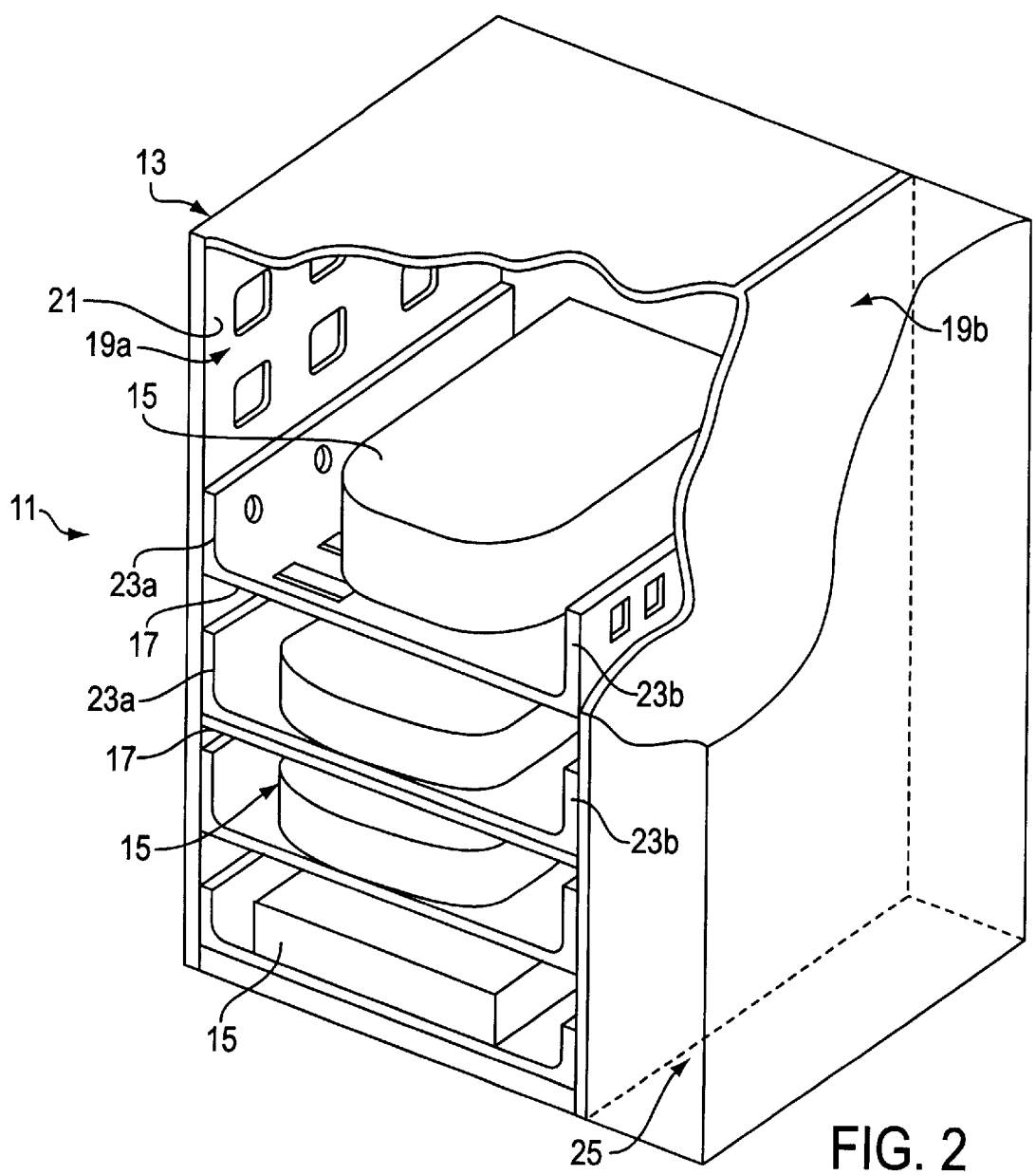
FIG. 2 is a cutaway isometric view of the computer subsystem of FIG. 1, depicting a plurality of hard disk drive assemblies mounted on roll bond support brackets in heat-exchange contact with the computer subsystem's roll bond enclosure.
Figure 3:
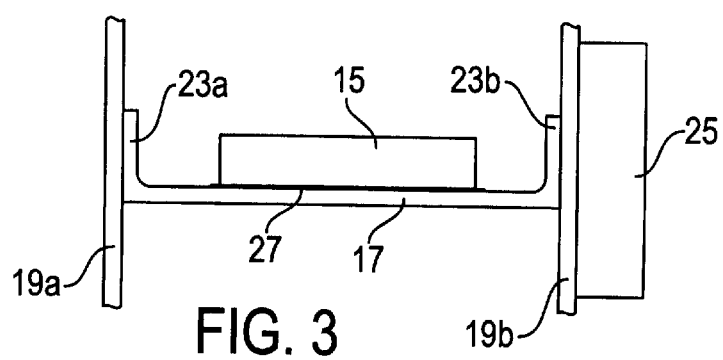
FIG. 3 is a simplified elevational view of a portion of the computer subsystem of FIG. 2, depicting one hard disk drive assembly and its roll bond support bracket in heat-exchange contact with the computer subsystem's roll bond enclosure.

With reference now to the illustrative drawings, and particularly to FIGS. 1–3, there is shown a computer subsystem 11 incorporating a special cooling apparatus that utilizes the subsystem's structural enclosure 13 to effect cooling by convection and radiation. The depicted computer subsystem is configured to house a plurality of hard disk drive assemblies 15, each supported on a separate mounting bracket 17. In this case, four disk drive assemblies and four mounting brackets are depicted, and each mounting bracket extends from one side panel 19a of the enclosure to another 19b. In the past, such disk drive assemblies typically were cooled by a fan arranged to direct air across the drive assemblies, thus providing cooling by forced convection. In the computer subsystem of the invention, however, substantial cooling can be achieved without the need for a fan or other air mover, or at most requiring the need for a fan of substantially reduced size.

The computer subsystem 11 of the invention achieves cooling of its power dissipating disk drive assemblies 15 by configuring the side panels 19a and 19b of its enclosure 13 as structural roll bond panels, i.e., panels defined by two metal sheets bonded together in a manner that defines a closed fluid channel between them. Suitable roll bond panels can be obtained from Showa Aluminum Corporation, of Tokyo, Japan, or from Algoods, of Toronto, Canada. In the depicted panels, the fluid channels take the form of a closed labyrinth 21. A suitable low-boiling point working fluid, e.g., 3M Fluorinert®, is carried within each fluid channel. Alternatively, working fluids such as hydrofluoroether or alcohol could be used.

In operation, heat generated by the disk drive assemblies 15 is conducted via their mounting brackets 17 to the side panels 19a and 19b of the enclosure 13. This heat is conducted directly to the working fluid carried within those portions of the panels' fluid channels 21 located immediately adjacent to the mounting brackets. The working fluid absorbs this heat, at least in part by evaporation, and the evaporated fluid migrates throughout the channels, to heat the panels to a substantially uniform temperature. Optimal conduction of heat throughout each panel is achieved by configuring the channel to occupy an area of about 20 to 50% of the panel's total surface area.

The heat distributed by the working fluid throughout the side panels 19a and 19b of the enclosure 13 is then dissipated by both convection and radiation. Utilizing the enclosure's external surface area in this way achieves effective cooling of the subsystem's power dissipating components without increasing the subsystem's overall size. Dissipation of heat from the enclosure condenses the fluid back to liquid form, whereupon it migrates by gravity and capillary action back to the locations immediately adjacent to the mounting brackets 17. A suitable wicking material, e.g., an open-cell porous metal or polymer, can be disposed within the fluid channels 21, to assist in wicking the liquid back to the desired locations. Optional fins 25 can be located on the panels' external and/or internal surfaces, to aid in the heat dissipation.

The conduction of heat from the disk drive assemblies 15 to the enclosure's side panels 19a and 19b is enhanced by configuring the mounting brackets 17 likewise as roll bond panels, i.e., panels that each define a fluid channel in the form of a closed labyrinth. A suitable working fluid, e.g., 3M Fluorinert®, is carried within these channels. The working fluid disposed in portions of each fluid channel immediately adjacent to, i.e., beneath, the disk drive assembly will absorb heat from the disk drive assembly, in part, by evaporation, and the evaporated fluid, or vapor, will migrate throughout the channel to heat the entire mounting bracket to a substantially uniform temperature. A suitable thermally conductive interface material 27 can be interposed between each disk drive assembly and its mounting bracket, to enhance the conduction of heat. To accommodate possible irregularities in the surface of the disk drive assembly, the thermally conductive interface material preferably is compliant. As is the case with the enclosure's side panels, the fluid channel of each mounting bracket preferably occupies about 20 to 50% of the bracket's total surface area.

Any temperature gradient at the interface between the mounting brackets 17 and the enclosure's side panels 19a and 19b will cause heat to be conducted to the side panels. This condenses the fluid located in the portions of the brackets' fluid channels immediately adjacent to the side panels. The condensed fluid then migrates by capillary action back to the portions of the fluid channels immediately beneath the disk drive assemblies 15. Thus, a cooling cycle is achieved in which the working fluid effectively transports heat away from the disk drive assemblies to the external panels.

With particular reference to FIGS. 2 and 3, the mounting brackets 17 each include flanges 23a and 23b on their side edges, for securement to the enclosure's respective side panels 19a and 19b. These flanges facilitate an efficient transfer of heat. In addition, as mentioned above, one or both of the side panels also can carry fins 25 on their internal and/or external surfaces, to aid in the dissipation of heat. Other treatments for the surfaces alternatively could be used.

The cooling apparatus thus can cool the computer subsystem's internal power dissipating components by effectively utilizing structural components, e.g., mounting brackets 17 and enclosure panels 19a and 19b that are already present. Depending on the amount of heat being dissipated and the computer subsystem's physical size, the need for supplementary fan cooling can sometimes be eliminated altogether. If a fan still is needed, its size can be significantly reduced.

The roll bond configuration for the enclosure's side panels 19a and 19b also can provide advantages separate and apart from cooling of the computer subsystem's internal components. For example, portions of the channels formed in the panels can be filled with noise- and vibration-damping materials, e.g., polyurethane. In addition, the panels' internal and external surfaces can be treated to increase heat transfer or to minimize superheat. Further, the panels can contain roll bonded ribs, with or without fluid, to stiffen the panel and the enclosure, and thereby to create features to alleviate structural dynamic issues. Basically, the roll bond structure provides high stiffness, yet low mass.

Figure 4:
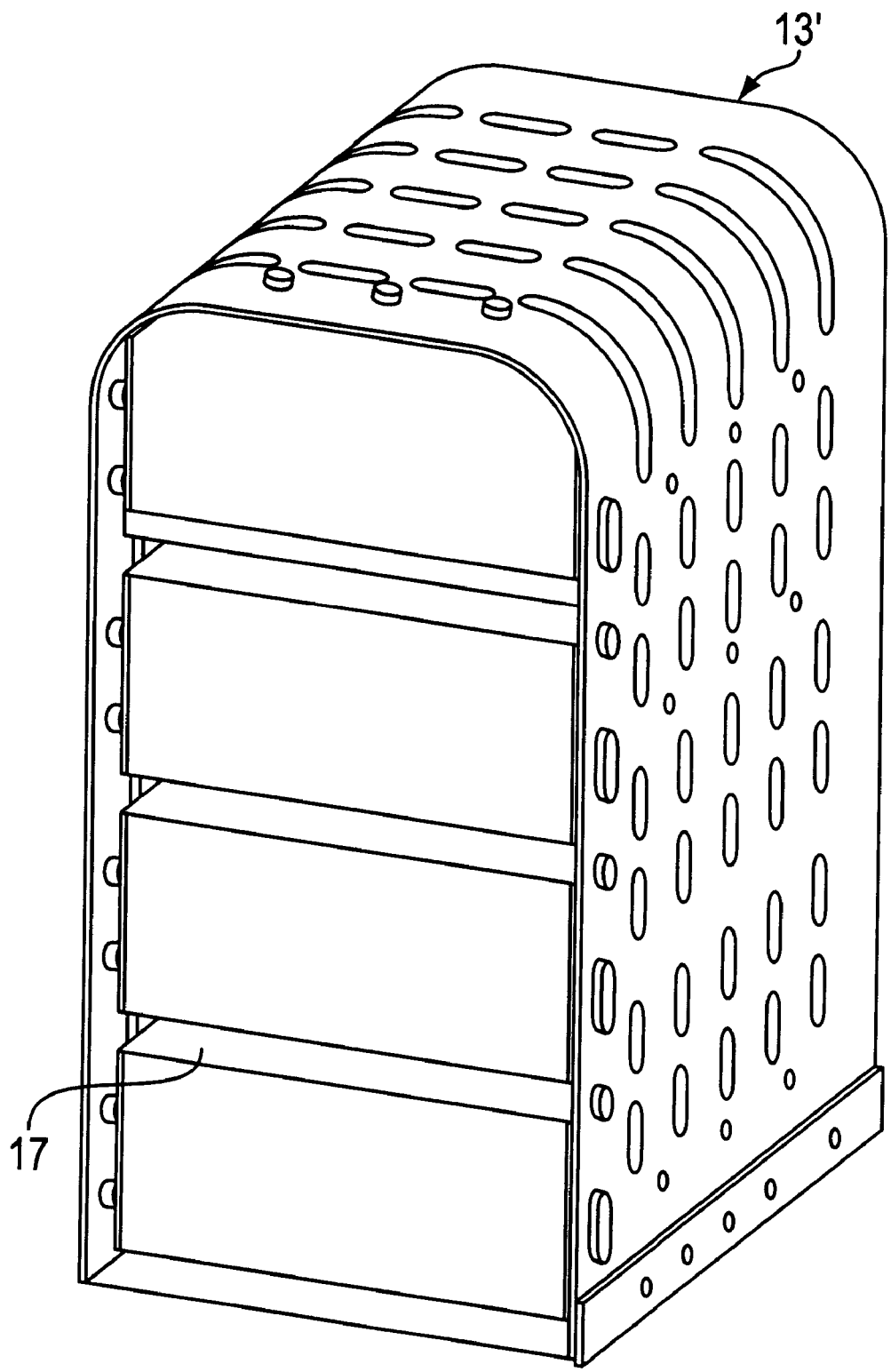
FIG. 4 is an isometric view of a second computer subsystem incorporating a cooling apparatus in accordance with the invention, wherein the roll bond panel that forms the enclosure of this subsystem is configured differently from that of the subsystem of FIG. 1.

FIG. 4 depicts an alternative computer subsystem enclosure 13', in which a single roll bond panel is bent to form the enclosure's two sides and top. This configuration eliminates two seams, and it functions to distribute heat from the subsystem's internal components over a larger area, for dissipation by convection and radiation.

Figure 5:
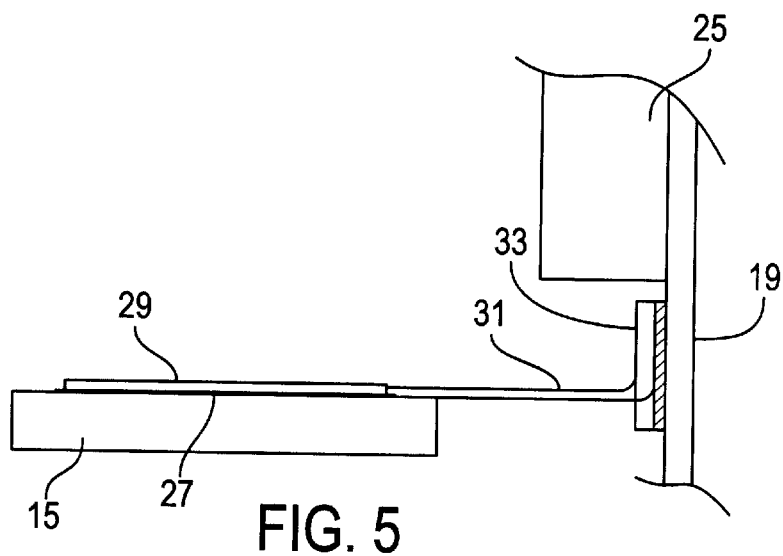
FIG. 5 is a schematic elevational view of an alternative structure for mounting a hard disk drive assembly in heat-exchange contact with a computer subsystem's roll bond enclosure, the structure including an evaporator secured to the hard disk drive assembly and a heat pipe coupled between the evaporator and the roll bond enclosure.

FIG. 5 is a schematic depiction of an alternative structure for mounting the disk drive assembly 15 and conducting heat from the disk drive assembly to the enclosure's side panel 19. In this alternative structure, the roll bond mounting bracket is substituted by an evaporator 29, one or more heat pipes 31, and a heat transfer plate 33. The evaporator is secured to the disk drive assembly with a thermally conductive interface material 27 interposed between them, to provide enhanced heat conduction. The evaporator and heat pipes together carry a working fluid that undergoes a phase change between a liquid and a gas, to aid in the transfer of heat to the heat transfer plate and, in turn, to the side panel. The evaporator can take the form of copper block having a flat surface secured to the disk drive assembly and further having one or more pencil-sized heat pipes embedded within it, e.g., by epoxy or a press-fit.

As in the embodiments described above, the working liquid carried within the evaporator 29 and heat pipe 31 of the embodiment of FIG. 5 evaporates in the region of the disk drive assembly 15, and it condenses in the region of the side panel 19. The condensed liquid returns by capillary action to the region of the disk drive assembly.

Figure 6:
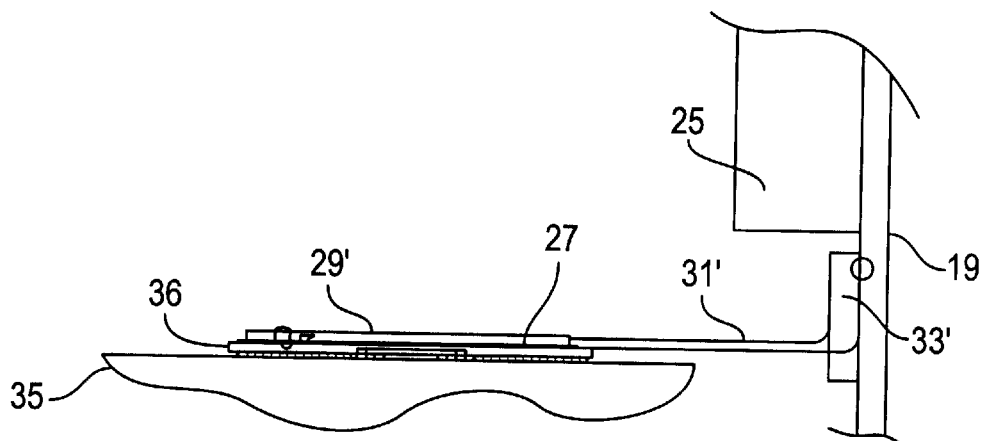
FIG. 6 is a schematic elevational view of a structure similar to that depicted in FIG. 5, but mounting a printed circuit board that carries one or more microprocessors.

FIG. 6 is a schematic depiction similar to FIG. 5, except that it depicts a structure for mounting a printed circuit (PC) board 35 that carries one or more microprocessors 36. Future microprocessors are expected to dissipate as much as 200 watts of power, so efficiently conducting this heat away from the PC board is particularly important. In the depicted structure, an evaporator 29' is secured to the microprocessor, with a thermally conductive interface material 27' interposed between them. The evaporator has the form of a metal plate with a bore formed within it, sized to receive one end of a heat pipe 31'. The heat pipe is secured in place by friction or by a suitable adhesive. The other end of the heat pipe is similarly received within a bore formed in a heat transfer plate 33' secured to the enclosure's side panel 19'''.

A suitable working fluid is located within the heat pipe 31', for evaporating in the portion of it located within the evaporator 29' and condensing in the portion of it located within the plate 33'. This effectively transfers heat from microprocessors 36 to the enclosure's side panel 19'''.

Figure 7:
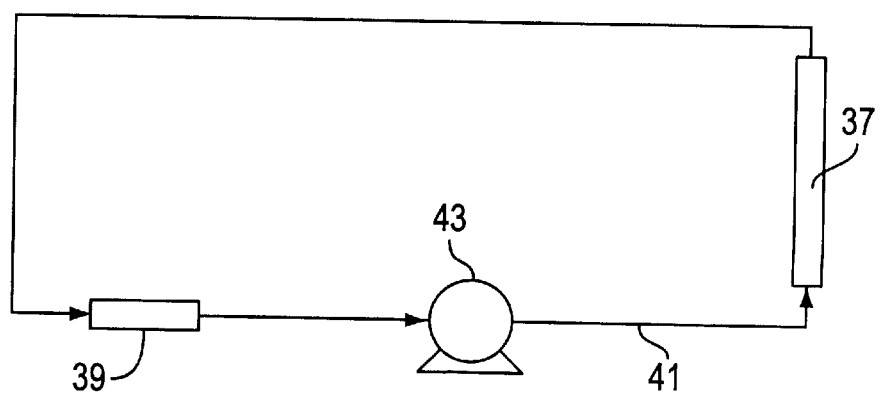
FIG. 7 is a simplified schematic view of an alternative embodiment of a cooling apparatus in accordance with the invention, for use in the computer subsystem of FIGS. 1 or 4, the embodiment including a closed-loop fluid channel in which a liquid coolant is circulated, with one portion of that channel being defined by the computer subsystem's roll bond enclosure.

An alternative embodiment of a cooling apparatus in accordance with the invention is depicted schematically in FIG. 7. Like the embodiment of FIGS. 1–3, the embodiment of FIG. 7 incorporates an enclosure formed from one or more roll bond panels (as identified by the reference numeral 37), and a working fluid is disposed within a fluid channel defined in the roll bond panels. However, the FIG. 7 embodiment does not achieve cooling using a phase change in the working fluid. Instead, the working fluid remains a liquid, and it fills the entire volume of a closed loop fluid path defined by a cold plate 39, one or more fluid conduits 41, and the roll bond panels. The cold plate is secured directly to the computer subsystem's power dissipating components, and it conveniently can take the form of a roll bond panel. A pump 43 continuously circulates the liquid along the closed loop fluid path.

Multiple disk drive assemblies and microprocessors can be cooled by the cooling apparatus of FIG. 7. These various power dissipating components can be connected to the closed loop fluid path either in series or in parallel. The enclosure's roll bond panels 37 function as a heat exchanger, cooling the working liquid before it is returned to the sources of heat. In this embodiment, the working fluid preferably incorporates both water and 60% ethylene glycol. Ethylene glycol is used for corrosion inhibition and freeze protection.

It should be appreciated from the foregoing description that the present invention provides an improved apparatus for cooling the power dissipating components of a computer subsystem, including microprocessors and hard disk drive assemblies. The apparatus utilizes the computer subsystem's chassis or enclosure by configuring it as a roll bond panel formed from two sheets bonded together to define a fluid channel therebetween, with a working fluid disposed within that channel. Various power dissipating components are mounted within the enclosure on special component panels that are mounted in heat-exchange contact with the enclosure's roll bond panel and that, themselves, define internal fluid channels. During operation, heat generated by the power dissipating components is transferred to the working liquid within the fluid channels of the component panels and, in turn, to the working fluid disposed within the fluid channel of the enclosure panel, for dissipation by convection. In one preferred embodiment, the working fluid undergoes a phase change, to facilitate an efficient transfer of heat throughout the enclosure panel and thereby to heat the panel to a substantially uniform temperature.

Although the invention has been described in detail with reference only to the presently preferred embodiments, those skilled in the art will appreciate that various modifications can be made without departing from the invention. Accordingly, the invention is defined only by the following claims.

We claim:

1. A cooling apparatus for a computer subsystem having a concentrated source of power dissipation, comprising:

an enclosure 13 that includes an external panel formed from two sheets bonded together to define a sealed fluid channel therebetween;

a component 17 or panel 31 that defines a sealed fluid channel disposed in heat exchange contact with both the concentrated source of power dissipation and the enclosure panel; and a working fluid disposed within the sealed fluid channel of the component panel and also within the sealed fluid channel of the enclosure panel;

wherein the working fluid disposed within the sealed fluid channel of the component panel undergoes a reversible phase change between a liquid and a gas, absorbing heat by evaporation in portions of the fluid channel located adjacent to the concentrated source of power dissipation, and releasing heat by condensation in portions of the fluid channel located adjacent to the enclosure panel;

and wherein the working fluid disposed within the sealed fluid channel of the enclosure panel likewise undergoes a reversible phase change between a liquid and a gas, absorbing heat by evaporation in portions of the fluid channel located adjacent to the component panel, and releasing heat by condensation in other portions of the fluid channel, for dissipation by convection.

2. A cooling apparatus for a computer subsystem as defined in claim 1, wherein the sealed fluid channel of the enclosure panel is a lattice of interconnected paths.

3. A cooling apparatus for a computer subsystem as defined in claim 1, wherein the sealed fluid channel of the enclosure panel is configured to maintain the enclosure panel at a substantially uniform temperature.

4. A cooling apparatus for a computer subsystem as defined in claim 1, wherein:

the working fluid that condenses within the portion of the sealed fluid channel of the component panel adjacent to the enclosure panel is transported by capillary action to the portion of the channel adjacent to the concentrated source of power dissipation; and the working fluid that condenses within the sealed fluid channel of the enclosure panel is transported by gravity to the portion of the channel adjacent to the component panel.

5. A cooling apparatus for a computer subsystem as defined in claim 1, wherein:

the concentrated source of power dissipation includes one or more microprocessors 36 mounted on a substrate; and the component panel is configured to be in heat-exchange contact with the one or more microprocessors.

6. A cooling apparatus for a computer subsystem as defined in claim 5, and further comprising a thermally conductive interface material disposed between the component 27 panel and the one or more microprocessors.

7. A cooling apparatus for a computer subsystem as defined in claim 5, wherein the component panel includes:

a plate 33 configured with an internal passageway and arranged in heat-exchange contact with the one or more microprocessors; and a heat pipe having an internal passageway connected to the internal passageway of the plate and arranged in heat-exchange contact with the enclosure panel.

8. A cooling apparatus for a computer subsystem as defined in claim 1, wherein:

the concentrated source of power dissipation includes a disk drive assembly; and the component panel mechanically supports the disk drive assembly.

9. A cooling apparatus for a computer subsystem as defined in claim 8, and further comprising a thermally conductive interface material disposed between the component panel and the disk drive assembly.

10. A cooling apparatus for a computer subsystem as defined in claim 8, wherein the component panel is formed from two sheets bonded together to define a sealed fluid channel therebetween.

11. A cooling apparatus for a computer subsystem as defined in claim 10, and further comprising a wick material disposed within the sealed fluid channel of the enclosure panel and within the sealed fluid channel of the component panel.

12. A cooling apparatus for a computer subsystem having a concentrated source of power dissipation, the cooling apparatus comprising:

an enclosure that includes an external panel formed from two sheets bonded together to define a liquid channel therebetween;

a cold plate configured to define a liquid channel connected to the liquid channel of the enclosure panel and further configured to be in heat exchange contact with the concentrated source of power dissipation;

wherein the connected liquid channels of the enclosure panel and the cold plate define a closed-loop fluid path;

a working liquid disposed within the closed-loop fluid path; and a pump that pumps the working liquid along the closed-loop fluid path, such that heat is transferred from concentrated source of power dissipation to the working liquid disposed within the liquid channel of the cold plate, and heat is transferred from the working liquid disposed within the liquid channel of the enclosure panel to the enclosure panel, thereby controlling the temperature of the concentrated source of power dissipation.

13. A cooling apparatus for a computer subsystem as defined in claim 12, wherein the liquid channel of the enclosure panel is a lattice of interconnected paths.

14. A cooling apparatus for a computer subsystem as defined in claim 12, wherein the liquid channel of the enclosure panel is configured to maintain the panel at a substantially uniform temperature.

15. A cooling apparatus for a computer subsystem as defined in claim 12, wherein:

the concentrated source of power dissipation includes one or more microprocessors mounted on a substrate; and the cold plate is configured to be in heat-exchange contact with the one or more microprocessors.

16. A cooling apparatus for a computer subsystem as defined in claim 15, and further comprising a thermally conductive interface material disposed between the component panel and the one or more microprocessors.

17. A cooling apparatus for a computer subsystem as defined in claim 12, wherein:

the concentrated source of power dissipation includes a disk drive assembly; and the cold plate mechanically supports the disk drive assembly.

18. A cooling apparatus for a computer subsystem as defined in claim 17, and further comprising a thermally conductive interface material disposed between the component panel and the disk drive assembly.

19. A cooling apparatus for a computer subsystem as defined in claim 12, wherein the component panel is formed from two sheets bonded together to define a sealed fluid channel therebetween.

* * * * *